(12) United States Patent
Ning

(10) Patent No.: US 6,979,526 B2
(45) Date of Patent: Dec. 27, 2005

(54) LITHOGRAPHY ALIGNMENT AND OVERLAY MEASUREMENT MARKS FORMED BY RESIST MASK BLOCKING FOR MRAMS

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 164 days.

(21) Appl. No.: 10/161,867

(22) Filed: Jun. 3, 2002

(65) Prior Publication Data

US 2003/0224260 A1 Dec. 4, 2003

(51) Int. Cl.[7] ............................. G03F 9/00; G03F 7/40; H01L 21/00; H01L 21/311; H01L 21/20
(52) U.S. Cl. ...................... 430/314; 430/315; 430/319; 430/324; 438/3; 438/59; 438/253; 438/296; 438/381; 438/698
(58) Field of Search ........................ 430/311, 313, 319, 430/324, 314, 315; 438/3, 381, 396, 59, 698, 438/253, 296

(56) References Cited

U.S. PATENT DOCUMENTS

| | | |
|---|---|---|
| 4,592,132 A | 6/1986 | Lee et al. |
| 4,657,629 A | 4/1987 | Bigelow |
| 5,002,902 A | 3/1991 | Watanabe |
| 5,100,834 A | 3/1992 | Mukai |
| 5,401,691 A | 3/1995 | Caldwell |
| 5,492,607 A | 2/1996 | Yap |
| 5,503,962 A | 4/1996 | Caldwell |
| 5,663,099 A | 9/1997 | Okabe et al. |
| 5,738,961 A | 4/1998 | Chen |
| 5,786,260 A | 7/1998 | Jang et al. |
| 5,935,764 A | 8/1999 | Kakehashi |
| 5,958,800 A | 9/1999 | Yu et al. |
| 6,133,111 A | 10/2000 | Sur et al. |
| 6,146,969 A | 11/2000 | Tan et al. |
| 6,174,737 B1 | 1/2001 | Durlam et al. |
| 6,183,614 B1 | 2/2001 | Fu |
| 6,284,551 B1 | 9/2001 | Cho et al. |
| 6,319,767 B1 | 11/2001 | Cha et al. |
| 6,346,454 B1 | 2/2002 | Sung et al. |
| 6,420,261 B2 | 7/2002 | Kudo |
| 6,447,634 B1 | 9/2002 | Zahorik et al. |
| 6,555,925 B1 | 4/2003 | Higashi et al. |

(Continued)

FOREIGN PATENT DOCUMENTS

DE 102 27 211 A1 2/2003

OTHER PUBLICATIONS

K.K.H. Wong, S. Kaja, P.W. Dehaven; Metallization by Plating for High-Performance Multichip Modules; IBM J. Res. Develop., vol. 42, No. 5, Sep. 1998, pp. 587-596.

(Continued)

Primary Examiner—Richard L. Schilling
(74) Attorney, Agent, or Firm—Slater & Matsil, L.L.P.

(57) ABSTRACT

A method of manufacturing a resistive semiconductor memory device (10), comprising depositing an insulating layer (34) over a workpiece (30), and defining a pattern for a plurality of alignment marks (22) and a plurality of conductive lines (54) within the insulating layer (34). A resist (50) is formed over the alignment marks (22), and a conductive material (52) is deposited over the wafer to fill the conductive pattern. The wafer is chemically-mechanically polished to remove excess conductive material from over the insulating layer and form conductive lines (54). The resist (50) is removed from over the alignment marks (22), and the alignment marks (22) are used for alignment of subsequently deposited layers of the resistive memory device (10).

22 Claims, 3 Drawing Sheets

U.S. PATENT DOCUMENTS

| | | |
|---|---|---|
| 6,780,775 B2 | 8/2004 | Ning |
| 2001/0001077 A1 | 5/2001 | Tan et al. |
| 2001/0001571 A1 | 5/2001 | Johnson et al. |
| 2001/0001735 A1 | 5/2001 | Chu et al. |
| 2001/0040778 A1 | 11/2001 | Abraham et al. |
| 2002/0009876 A1 | 1/2002 | Wege et al. |
| 2002/0072195 A1 | 6/2002 | Anma et al. |
| 2002/0096775 A1 | 7/2002 | Ning |
| 2002/0098705 A1 * | 7/2002 | Low ............ 438/698 |
| 2002/0098707 A1 | 7/2002 | Ning |
| 2002/0100978 A1 | 8/2002 | Tomita et al. |
| 2002/0153551 A1 * | 10/2002 | Wong et al. ......... 257/303 |
| 2002/0192926 A1 | 12/2002 | Schroeder et al. |
| 2003/0017707 A1 | 1/2003 | Yamashita et al. |
| 2003/0102576 A1 | 6/2003 | Teramoto |
| 2003/0224260 A1 | 12/2003 | Ning |
| 2004/0038543 A1 | 2/2004 | Zahorik et al. |
| 2004/0043579 A1 | 3/2004 | Nuetzel et al. |
| 2004/0102014 A1 | 5/2004 | Ning et al. |
| 2005/0079683 A1 | 4/2005 | Sarma et al. |

OTHER PUBLICATIONS

Bajaj, et al., "Manufacturability Considerations and Approaches for Development of a Copper CMP Process", 1999 VMIC Conference, pp. 144-151, 1999 IMIC 109/99/0144 (c).

Raghavan, et al., "Electrochemical Behavior of Copper and Tantalum in Silica Slurries Containing Hydroxylamine", 1999 VMIC Conference pp. 619-626, 1999 IMIC 109/99/0619 (c).

Wang, et al., "Pad Wear Analysis in CMP", 1999 VMIC Conference; pp. 267-269, 1999 IMIC 109/99/0267 (c).

* cited by examiner

LITHOGRAPHY ALIGNMENT AND OVERLAY MEASUREMENT MARKS FORMED BY RESIST MASK BLOCKING FOR MRAMS

CROSS-REFERENCE TO RELATED APPLICATIONS

This invention is related to U.S. patent application Ser. No. 09/854,760, filed on May 14, 2001 by Xian J. Ning, entitled "Design of Lithography Alignment and Overlay Measurement Marks on CMP Finished Damascene Surface", which is incorporated herein by reference.

TECHNICAL FIELD

The present invention relates generally to the fabrication of semiconductor devices, and more particularly to the fabrication of magnetic random access memory (MRAM) devices.

BACKGROUND OF THE INVENTION

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a crosspoint. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

Alignment techniques are implemented during manufacturing processes to ensure correct alignment of the various layers with one another within semiconductor devices such as MRAMs. Typically, alignment marks are utilized in the layers to assist in the alignment of features in different layers.

MRAM devices are typically processed using structures upon which are formed a plurality of magnetic metal stacks which comprise the magnetic memory cells. A magnetic stack consists of many different layers of metals and a thin layer of dielectric having a total thickness of a few tens of nanometers. The magnetic stacks are typically built on top of copper channels embedded in an inter-level dielectric (ILD) material.

Because the magnetic stacks are not transparent to light, the lithography on top of the magnetic stack layer requires topographic features for alignment and overlay measurement marks on the magnetic stack layer. Typically this underlying magnetic stack layer requires a chemical mechanical polish (CMP) process as a finish step.

Alignment marks are usually formed using additional lithography and reactive ion etch (RIE) steps to generate marks on the CMP-finished surface that exposes the copper and dielectric patterns. However, forming alignment marks in this manner requires an additional RIE process step and subsequent cleaning steps, thus increasing the processing costs and also increasing the chance of leaving particles on the CMP finished level. Also, an additional lithography mask is required to pattern the alignment marks, and the additional lithography mask must be aligned to an underlying layer, which reduces the overall overlay tolerance.

SUMMARY OF THE INVENTION

Preferred embodiments of the present invention achieve technical advantages as a method of transferring the previous level alignment and overlay marks directly into a magnetic stack level, without requiring an additional reactive-ion etch (RIE) process to form the alignment marks.

In one embodiment, a method of manufacturing a resistive memory device includes providing a semiconductor workpiece, forming an insulating layer over the workpiece, and defining a pattern for a plurality of alignment marks and a plurality of conductive lines within the insulating layer. A resist is formed over the alignment marks, and a conductive material is deposited over the insulating layer to fill the conductive line pattern and form conductive lines, leaving excess conductive material disposed over the conductive lines. The resist is removed from over the alignment marks, and the excess conductive material is removed from over the conductive lines, wherein the alignment marks may be used for alignment of subsequent layers of the resistive semiconductor memory device.

In another embodiment, a method of manufacturing a resistive semiconductor memory device includes providing a semiconductor workpiece, forming an insulating layer having a top surface over the workpiece, and, using a damascene process, patterning the insulating layer to form a plurality of alignment marks and a plurality trenches for conductive lines. The method includes depositing a liner over the alignment marks and conductive line trenches, depositing a resist over the liner, and removing the resist, leaving a portion of the resist residing over the alignment marks. A conductive material is deposited over the insulating layer to fill the conductive line pattern and form conductive lines, leaving excess conductive material disposed over the conductive lines. The resist is removed from over the alignment marks, the excess conductive material is removed from over the conductive lines, and the liner is removed from the insulating layer top surface. The alignment marks may be used for alignment of subsequent layers of the MRAM.

Advantages of embodiments of the invention include forming an MRAM device, wherein the same alignment and overlay measurement marks in a CMP-finished level (such as the process flow for forming conductive lines, to be described further herein) are used as the alignment and overlay measurement marks that are used to align a subsequently-deposited magnetic material stack. Because the original alignment marks are preserved, an additional patterning, etch and cleaning step is avoided. Furthermore, alignment is more accurate, because there is no need to align new alignment marks with already existing alignment marks. Overlay budget is increased, because an additional overlay is not required.

Other advantages include a resist being used to block conductive material deposition within the alignment marks, beneficial in that the resist may be left intact during the conductive material CMP process, preventing the CMP slurry from entering and becoming trapped within the alignment marks, thus preserving the alignment mark shape. The alignment mark depth is adjustable, being either the same depth as conductive lines, in a single damascene process, or alternatively, being the same depth as conductive line depth plus via depth in a dual damascene process.

BRIEF DESCRIPTION OF THE DRAWINGS

The above features of the present invention will be more clearly understood from consideration of the following descriptions in connection with the accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be described, followed by a discussion of some advantages of embodiments of the present invention.

Embodiments of the present invention include a method of transferring previous level alignment and overlay marks directly into a magnetic stack level, without requiring an additional RIE process step to create new alignment marks.

Figure 1:
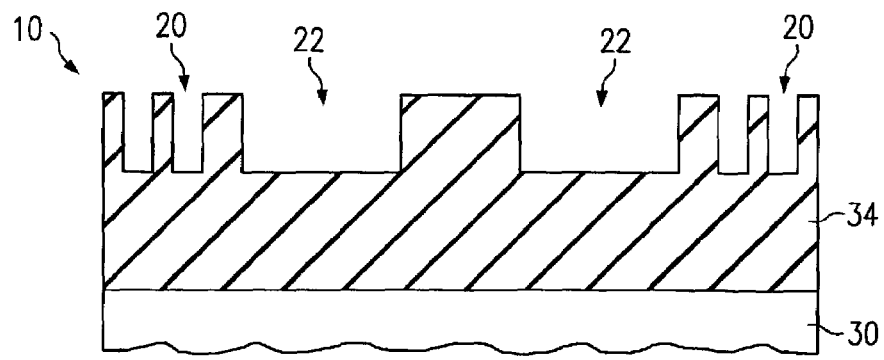
FIGS. 1 through 6 show cross-sectional views of an MRAM device having alignment marks formed in a single damascene process in various stages of manufacturing in accordance with an embodiment of the present invention.

FIGS. 1 through 6 illustrate cross-sectional views of an MRAM device in various stages of manufacturing, in accordance with a first embodiment of the present invention. FIG. 1 shows a semiconductor wafer 10 that will be processed to form a MRAM device, including a workpiece 30. The workpiece 30 may include a semiconductor substrate comprising silicon or other semiconductor materials covered by an insulating layer, for example. The workpiece 30 may also include other active components or circuits formed in the front end of line (FEOL), not shown. The workpiece 30 may comprise silicon oxide over single-crystal silicon, for example. The workpiece 30 may include other conductive layers or other semiconductor elements, e.g. transistors, diodes, etc. Compound semiconductors, GaAs, InP, Si/Ge, or SiC, as examples, may be used in place of silicon.

An insulating layer 34 is deposited over the workpiece, or cap layer. The insulating layer 34 preferably comprises an inter-level dielectric (ILD) layer, e.g., the wafer first inter-level dielectric. Alternatively, the insulating layer 34 may comprise a second or third inter-level dielectric, for example. The insulating layer 34 preferably comprises silicon dioxide ($SiO_2$) and may alternatively comprise other dielectric materials such as low dielectric constant materials, for example.

The insulating layer 34 is patterned and etched to form a plurality of trenches for conductive lines 20 and alignment marks 22, as shown. The trenches 20/22 may comprise a single damascene (shown in FIG. 1) or dual-damascene pattern (shown in FIG. 8, to be described further herein), formed by lithography and RIE, as examples. The insulating layer 34 may be lithographically patterned and reactive ion etched (RIE) to form trenches 20/22.

The embodiment shown in FIGS. 1 through 6 comprises a single damascene process. Preferably, the alignment mark trenches 22 and the conductive line trenches 20 comprise the same depth within the insulating layer 34. The conductive line trenches 20 may be about 0.2 $\mu$m wide and 0.4 to 0.6 $\mu$m deep, and the alignment mark trenches 22 may be about 5 to 20 $\mu$m wide, as examples. The alignment mark trenches 22 are also referred to herein as alignment marks. The alignment mark trenches 22 may also comprise overlay measurement marks, for example.

Figure 2:
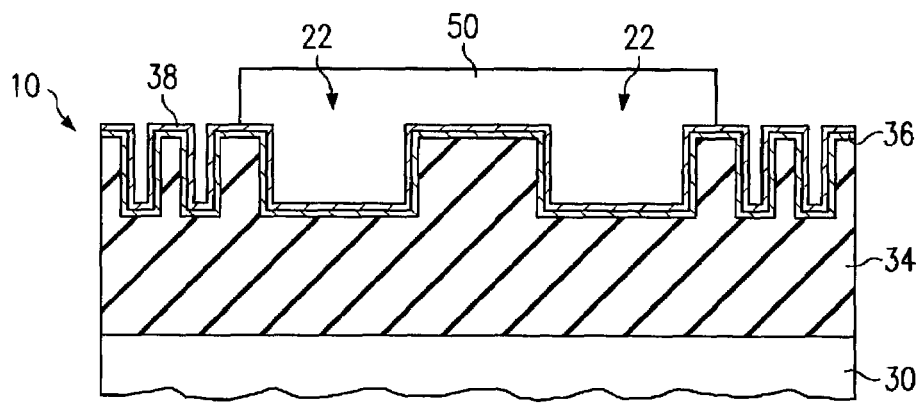

A liner 36/38 is formed over the wafer 10, as shown in FIG. 2. The liner 36/38 is preferably conductive, and preferably comprises a barrier layer 36 and a seed layer 38. The barrier layer 36 preferably comprises a material having a high conductivity that provides good adhesion to the underlying insulating layer 34 and also is adapted to act as a diffusion barrier, to prevent subsequently deposited materials such as copper from diffusing through the insulating layer 34. The barrier layer 36 may comprise a copper barrier, for example. For example, if conductive lines 54 (see FIG. 4) comprise copper, preferably, the liner 36/38 comprises a copper barrier layer 36 deposited over the insulating layer 34 surface within the trenches 20/22, including along the trench sidewalls. The barrier layer 36 may comprise TaN, TiN, WN, Ta, or combinations thereof, as examples. The barrier layer 36 may alternatively comprise other materials. The barrier layer 36 is preferably deposited in a thickness of about 5–100 nm.

The liner 36/38 preferably also comprises a seed layer 38 comprising a copper seed layer, for example, formed over the copper barrier 36. The seed layer 38 is adapted to improve the deposition of subsequently-deposited conductive material 52 (see FIG. 3), for example, in an electroplating process. The seed layer 38 preferably comprises pure copper, a copper alloy comprising magnesium, indium, aluminum, or combinations thereof, as examples. Alternatively, the seed layer 38 may comprise other conductive materials. The seed layer 38 is preferably deposited in a thickness of about 50–200 nm, for example.

Referring again to FIG. 2, a resist 50 is deposited over the wafer 10. The resist 50 preferably comprises an organic polymer photoresist, for example. The resist 50 is patterned using lithography, and portions of the resist 50 are removed, leaving resist 50 remaining over the alignment mark trenches 22.

Figure 3:
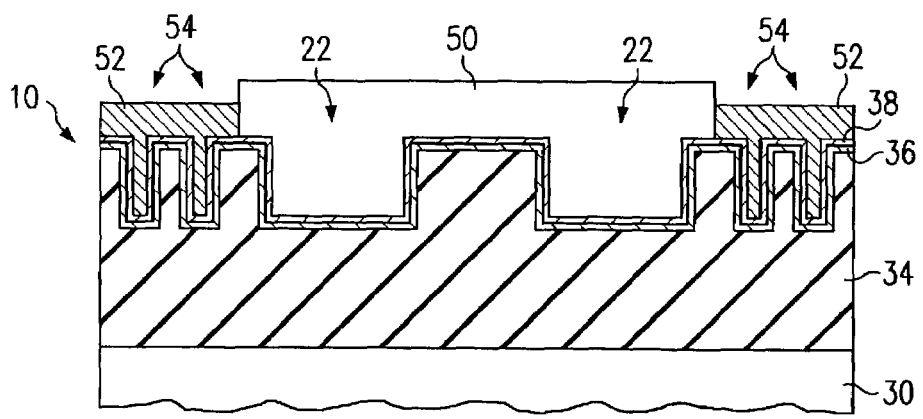

With the resist 50 remaining over the alignment mark trenches 22, a conductive material 52, preferably comprising copper, for example, is deposited over the wafer 10 and within the conductive line trenches 20, as shown in FIG. 3. The conductive material 52 may comprise a metal such as copper, preferably deposited by plating. Alternatively, the conductive material 52 may comprise other conductive materials such as Al, TiN, Ti, W, combinations thereof, or other conductive materials, deposited by physical vapor deposition (PVD) or chemical vapor deposition (CVD), as examples. The conductive material 52 for an MRAM device preferably comprises copper, which is desirable for its superior conductivity and the ability to use smaller conductive lines because of the high conductivity of copper. The liner 36/38 may be used to plate the conductive material 52 to form conductive lines 54, for example.

Figure 4:
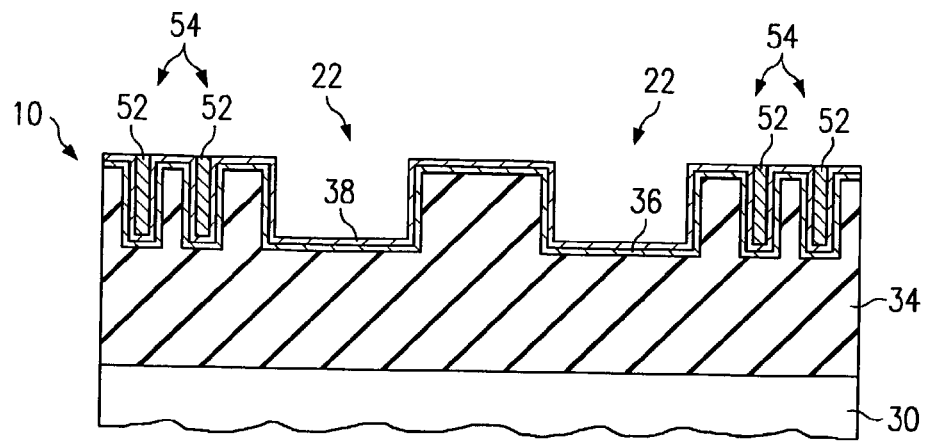

The resist 50 is cleaned from the wafer 10, as shown in FIG. 4, and then the conductive material 52 is exposed to a chemical-mechanical polish (CMP) process to remove the excess conductive material 52 and liner 36/38 from the top surface of the insulating material 34 and to form conductive lines 54. Conductive lines 54 include conductive material 52, seed layer 38 and barrier layer 36. Conductive lines 54 may comprise wordlines or bitlines of the MRAM device 10, for example.

The damascene process described herein is preferably used to form conductive lines 54 comprising copper, because copper is difficult to etch. Conductive lines 54 may be part of an M1 or M2 metallization layer, as examples. The conductive lines 54 may comprise minimum pitched lines (e.g., having the smallest feature size) or alternatively, the conductive lines 54 may comprise larger pitched lines.

In one embodiment, the resist 50 strip and conductive material 52 CMP steps are reversed. With the resist 50 still residing over the alignment marks 22, the conductive material 52 is exposed to a chemical-mechanical polish (CMP) process to remove the excess conductive material 52, liner 36/38 and resist 50 from the top surface of the insulating material 34 to form conductive lines 54. The CMP may be designed such that the CMP process stops at the insulating material 34, for example. Then, the resist 50 may be removed from within the alignment mark trenches 22. This embodiment is advantageous in that the presence of resist 50 material inside the alignment mark trenches 22 prevents CMP slurry from becoming trapped in the alignment mark trenches 22, which can cause an irregular shape of the alignment marks 22.

Figure 5:
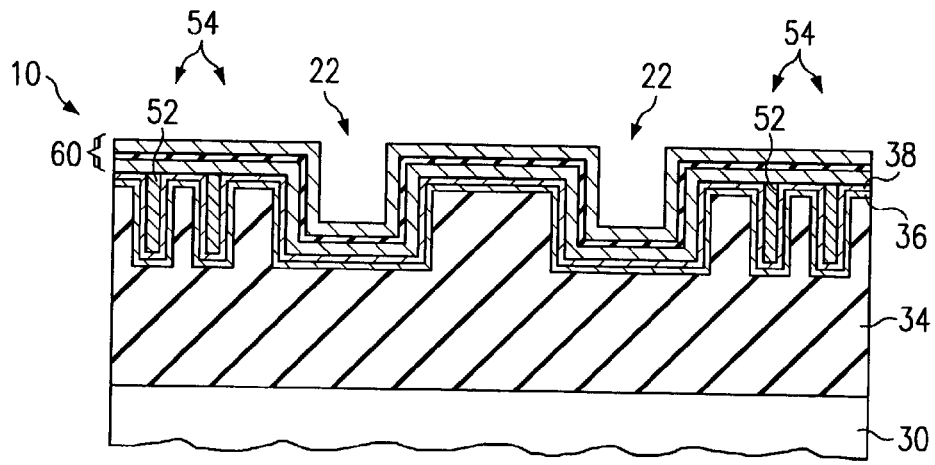

Next, a magnetic stack material 60 is deposited over the wafer to line all exposed surfaces, such as the conductive lines 54, insulating layer 34 top surface, and alignment mark trenches 22, as shown in FIG. 5. The magnetic stack material 60 preferably comprises a non-transparent metal level. More particularly, the magnetic stack material 60 preferably comprises a first magnetic layer comprised of a plurality of layers of materials such as PtMn, CoFe, Ru, NiFe, Ni, Co, and/or combinations thereof, using various ratios of these chemical elements, as examples. Magnetic stack material 60 includes a dielectric layer, comprising aluminum oxide ($Al_2O_3$), for example, deposited over the first magnetic layer. Magnetic stack material 60 also includes a second magnetic layer deposited over the dielectric layer, the second magnetic layer comprising a similar multi-layer structure using similar materials as the first magnetic layer. The various material layers of the magnetic stack may be deposited by PVD, for example.

Figure 6:
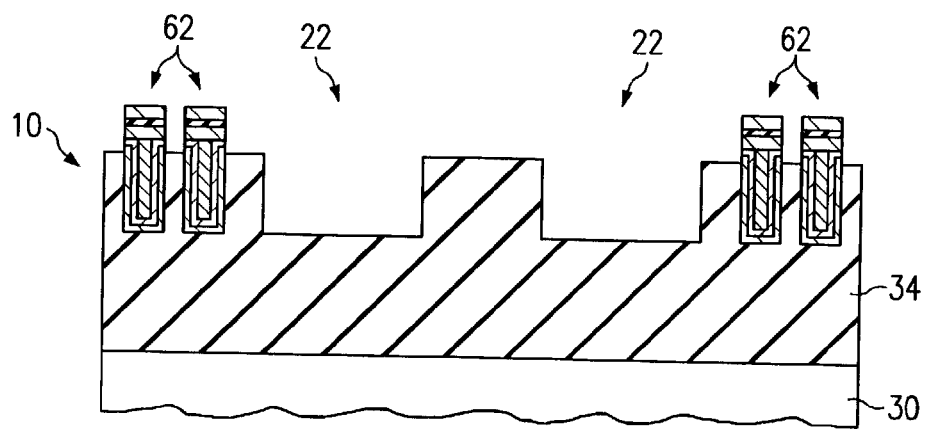

The topography of the alignment marks 22 is transferred to the surface of the magnetic stacks 22 and is visible from the top surface of the wafer. The magnetic stack material 60 is patterned using lithography and etched to form magnetic memory cells 62 or magnetic tunnel junctions (MTJ's) over the conductive lines 54, as shown in FIG. 6. Advantageously, the magnetic stack material 60 is removed from the alignment mark trenches 22 in this processing step, so that the same alignment marks may be used in the next lithography process. Processing of the MRAM device 10 is continued, such as depositing a tunnel junction insulator, and forming conductive lines over the magnetic memory cells 62 to form wordlines or bitlines of the MRAM array 10, for example (not shown).

Figure 7:
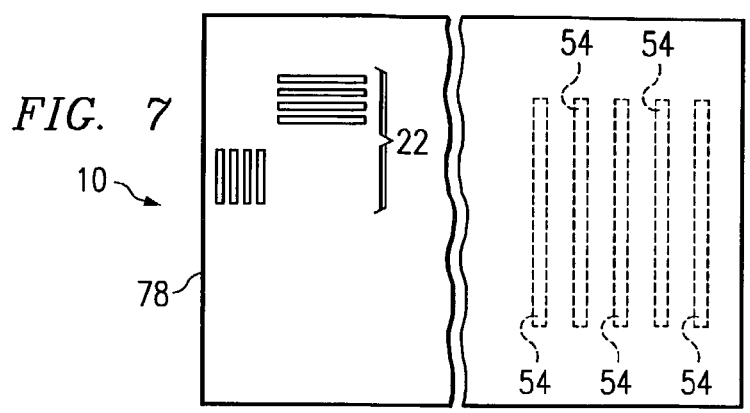
FIG. 7 shows a top view of the device shown in FIG. 6.

A top view of the alignment marks 22 disposed on a wafer 10 in accordance with an embodiment of the present invention is shown in FIG. 7, after a subsequent material layer 78, e.g., a tunnel junction barrier layer is deposited over the magnetic memory cells 62. The alignment marks 22 remain visible on the wafer because they are recessed below the wafer surface. Therefore, the alignment and overlay measurement marks 22 may be used to align subsequent layers.

Figure 8:
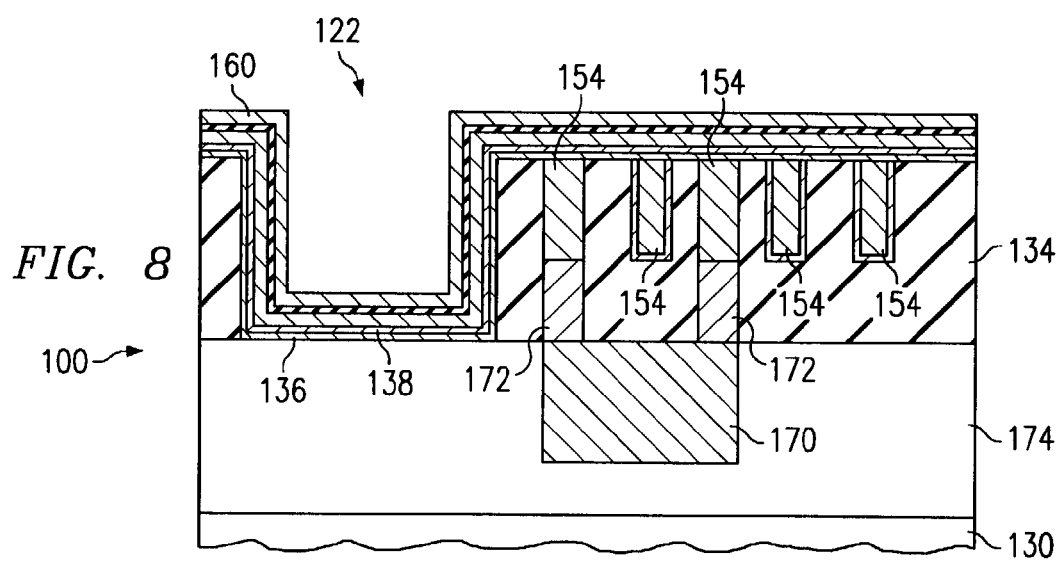
FIGS. 8 and 9 illustrate cross-sectional views of another embodiment of the present invention having alignment marks formed in a dual damascene process.
Figure 9:
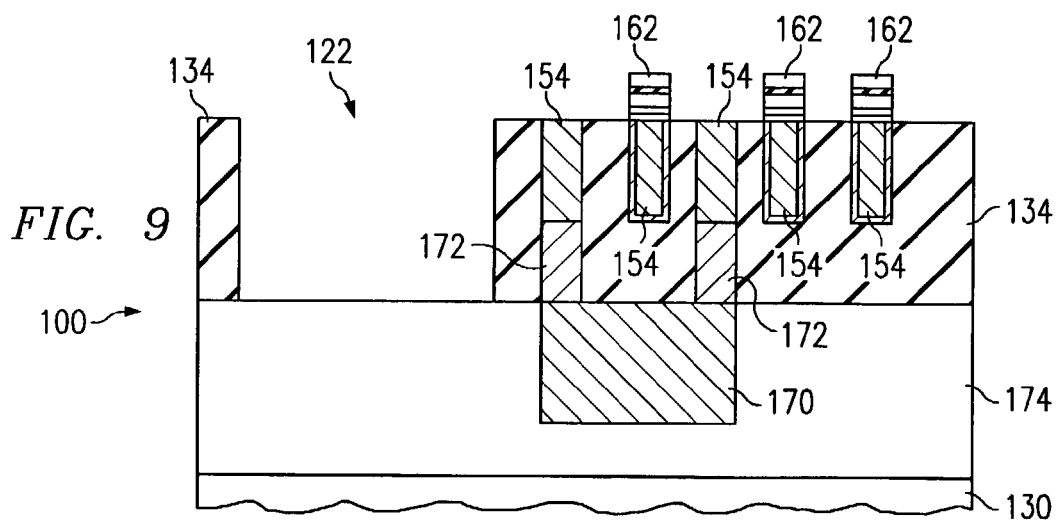

FIGS. 8 and 9 illustrate an embodiment of the present invention wherein a dual damascene process is used to form both vias 172 to underlying first conductive lines 170 formed within a first insulating layer 170. In this embodiment, the alignment mark trenches 122 may have the same depth as second conductive lines 154 plus the depth of vias 172, for example. It may take two processing steps or masks in order to etch the alignment mark trenches 122 and vias 172 (using a first etch step or mask), and the second conductive lines 154 (using a second etch step or mask), for example.

As in the embodiment described for FIGS. 1–7, a magnetic stack material 160 is deposited over the wafer 100, shown in FIG. 8. The magnetic stack material 160 is patterned and etched, leaving magnetic memory cells 162 disposed over the second conductive lines 154, as shown in FIG. 9. The alignment mark trenches 122 are then used for alignment during subsequent processing of the wafer 100.

Embodiments of the present invention achieve technical advantages as a process for forming an MRAM device wherein the same alignment and overlay measurement marks 22 in a CMP-finished level (such as the process flow for forming conductive lines 54 described herein) are used as the alignment and overlay measurement marks 22 that are used to align a subsequently-deposited magnetic material stack 60. Resist 50 is used to block the conductive material 52 deposition within the alignment marks 22. The resist 50 is also beneficial in that it may be left intact during the conductive material 52 CMP process, preventing the CMP slurry from entering and becoming trapped within the alignment marks 22, and thus preserving the alignment mark 22 shape. The alignment mark 22 depth is adjustable, being either the same depth as conductive lines 54, in a single damascene process, or alternatively, being the same depth as conductive lines 154 plus via 172 depth, in a dual damascene process.

Because the original alignment and overlay measurement marks 22/122 are preserved, an additional patterning, etch and cleaning step is avoided. Furthermore, alignment is more accurate, because there is no need to align new alignment marks with already existing alignment marks. Overlay budget is increased, because an additional overlay is not required.

Embodiments of the invention are described with reference to a particular application for an MRAM cell herein; however, embodiments of the invention also have application in other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a magnetoresistive semiconductor device, comprising:
   providing a semiconductor workpiece;
   forming an insulating layer over the workpiece;
   defining a pattern of trenches as a plurality of alignment mark trenches and a plurality of trenches for conductive lines within the insulating layer;
   forming a liner over said plurality of alignment mark trenches and said plurality of trenches for conductive lines;
   forming a resist over the alignment mark trenches;
   depositing a conductive material over the insulating layer not covered by the resist to fill the conductive line trenches and form conductive lines, leaving excess conductive material disposed over the conductive lines;
   removing the resist from over the alignment mark trenches and removing the excess conductive material from over the conductive lines, wherein the alignment mark trenches in the insulating layer are not covered by said conductive material; and then
   depositing a magnetic stack layer over all exposed surfaces including the conductive lines, the insulating layer top surface and the alignment mark trenches;
   patterning the magnetic stack layer to form a magnetic tunnel junction (MTJ) over each conductive line; and
   removing said liner and said resist in said alignment mark trenches to expose the insulating layer at the bottom and sidewalls of said alignment mark trenches, so that said alignment mark trenches are suitable for alignment of subsequent layers of the magnetoresistive semiconductor device.

2. The method according to claim 1, wherein removing the resist and excess conductive material comprises:
   first, removing the resist from over the alignment mark trenches; and
   second, using a chemical-mechanical polish process to remove the excess conductive material from over the conductive lines.

3. The method according to claim 1, wherein removing the resist and excess conductive material comprises:
   first, using a chemical-mechanical polish process to remove the excess conductive material from over the conductive lines; and
   second, removing the resist from over the alignment mark trenches.

4. The method according to claim 1, further comprising:
   removing the liner from a top surface of the insulating layer while removing the excess conductive material from over the conductive lines.

5. The method according to claim 4, wherein depositing a liner comprises depositing a barrier layer.

6. The method according to claim 5, wherein depositing a barrier layer comprises depositing 5–100 nm of TaN, TiN, WN, Ta, or combinations thereof.

7. The method according to claim 5, wherein depositing a liner comprises depositing a seed layer.

8. The method according to claim 7, wherein depositing a seed layer comprises depositing 50–200 nm of pure copper, a copper alloy comprising magnesium, indium, aluminum, or combinations thereof.

9. The method according to claim 4, wherein depositing a conductive material comprises depositing a material including copper.

10. The method according to claim 1, wherein depositing a conductive material comprises plating the conductive material.

11. The method according to claim 1, wherein depositing the conductive material comprises a single or dual Damascene process.

12. The method according to claim 1, wherein forming the resist comprises depositing a resist over the wafer, and removing a portion of the resist.

13. The method according to claim 1, wherein the alignment marks comprise overlay measurement marks.

14. A method of manufacturing a magnetic random access memory (MRAM) device, comprising:
   providing a semiconductor workpiece;
   forming an insulating layer having a top surface over the workpiece;
   using a damascene process, patterning the insulating layer to form a plurality of trenches for alignment marks and a plurality of trenches for conductive lines;
   depositing a liner over the alignment mark trenches and conductive line trenches;
   depositing a resist over the liner;
   removing the resist, leaving a portion of the resist residing over the alignment mark trenches;
   depositing a conductive material over the insulating layer not covered by the resist to fill the conductive line trenches and form conductive lines, leaving excess conductive material disposed over the conductive lines;
   removing the resist from over the alignment mark trenches;
   removing the excess conductive material from over the conductive lines, such that the alignment mark trenches are not covered by said conductive material; and then
   depositing a magnetic stack layer over all exposed surfaces including the conductive lines, the insulating layer top surface and the alignment mark trenches insulating layer;
   patterning the magnetic stack layer to form a magnetic tunnel junction (MTJ) over each conductive line; and
   removing all material in said alignment mark trenches including the liner to expose the insulating layer at the bottom and sidewalls of said alignment mark trenches, so that said alignment mark trenches are suitable for alignment of subsequent layers of the MRAM device.

15. The method according to claim 14, wherein the resist is removed from over the alignment marks after the excess conductive material is removed from over the conductive lines.

16. The method according to claim 14, wherein the excess conductive material is removed from over the conductive lines after the resist is removed from over the alignment mark trenches.

17. The method according to claim 14, wherein depositing a liner comprises depositing a barrier layer and depositing a seed layer.

18. The method according to claim 17, wherein depositing a barrier layer comprises depositing 5–100 nm of TaN, TiN, WN, Ta, or combinations thereof, wherein depositing a seed layer comprises depositing 50–200 nm of pure copper, a copper alloy comprising magnesium, indium, aluminum, or combinations thereof, and wherein depositing a conductive material comprises depositing a material including copper.

19. The method according to claim 14, wherein depositing a conductive material comprises plating the conductive material.

20. The method according to claim 14, wherein the alignment marks comprise overlay measurement marks.

21. A method of manufacturing an MRAM (Magnetic Random Access Memory) resistive semiconductor memory device, comprising:
   providing a semiconductor workpiece;
   forming an insulating layer over the workpiece;
   defining a pattern of trenches for a plurality of alignment mark trenches and a plurality of conductive lines within the insulating layer;
   forming a liner over said insulating layer, including said pattern of trenches;
   forming a resist over the alignment mark trenches having said liner;
   depositing a conductive material over the insulating layer to fill the lined conductive line trenches and to form conductive lines, leaving excess conductive material disposed over the conductive lines;
   removing the resist from over the alignment mark trenches to expose said liner;
   removing the excess conductive material from over the conductive lines to leave an exposed top surface;
   depositing a magnetic stack layer over the exposed liner and the top surface of the conductive liners where said excessive conductive material was removed;
   removing the magnetic stack layer material from said exposed liner such that said stack layer material remains only over said conductive lines so as to form magnetic tunnel junctions (MTJ); and
   removing said liner and said resist in said trenches for said plurality of alignment marks such that the alignment marks may be used for alignment of subsequent layers of the resistive semiconductor memory device.

22. A method of manufacturing a magnetic random access memory (MRAM) device, comprising:
   providing a semiconductor workpiece;
   forming an insulating layer having a top surface over the workpiece;
   using a damascene process, patterning the insulating layer to form a plurality of trenches for alignment marks and a plurality of trenches for conductive lines;
   depositing a liner over the alignment marks and conductive line trenches;
   depositing a resist over the liner;
   selectively removing the resist, leaving a portion of the resist residing over the alignment mark trenches having said liner;
   depositing a conductive material over the insulating layer to fill the lined conductive line trenches so as to form conductive lines, leaving excess conductive material disposed over the conductive lines;
   removing the resist from over the alignment mark trenches;
   removing the excess conductive material from over the conductive lines and removing the liner from the insulating layer top surface;
   depositing a magnetic stack layer over the exposed liner and the top surface of the conductive liners where said excessive conductive material was removed;
   removing the magnetic stack layer material from said exposed liner such that said stack layer material remains only over said conductive lines so as to form magnetic tunnel junctions (MTJ); and
   removing said liner and said resist in said plurality of trenches for alignment marks such that the alignment marks may be used for alignment of subsequent layers of the resistive semiconductor memory device.

* * * * *